United States Patent
Choi et al.

(10) Patent No.: US 8,517,249 B2
(45) Date of Patent: Aug. 27, 2013

(54) SOLDERING STRUCTURE AND METHOD USING ZN

(75) Inventors: Won-kyoung Choi, Suwon-si (KR); Chang-youl Moon, Suwon-si (KR); Yoon-chul Son, Suwon-si (KR); Young-ho Kim, Seoul (KR); Hee-ra Roh, Seoul (KR); Chang-yul Oh, Daejeon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 326 days.

(21) Appl. No.: 11/872,066

(22) Filed: Oct. 15, 2007

(65) Prior Publication Data

US 2008/0223906 A1    Sep. 18, 2008

(30) Foreign Application Priority Data

Mar. 12, 2007   (KR) ................. 10-2007-0024183

(51) Int. Cl.
     *B23K 35/14*   (2006.01)
(52) U.S. Cl.
     USPC .......................................... 228/254; 428/615
(58) Field of Classification Search
     USPC .......................................... 228/254; 428/615
     See application file for complete search history.

(56) References Cited

U.S. PATENT DOCUMENTS

| | | | |
|---|---|---|---|
| 3,594,616 A * | 7/1971 | Nitta et al. | 257/698 |
| 5,698,160 A | 12/1997 | Chen et al. | |
| 2004/0020045 A1 * | 2/2004 | Hirano | 29/846 |
| 2004/0155336 A1 * | 8/2004 | Yamaguchi et al. | 257/736 |
| 2004/0253474 A1 * | 12/2004 | Akamatsu et al. | 428/615 |
| 2006/0196408 A1 | 9/2006 | Hashimoto | |

FOREIGN PATENT DOCUMENTS

| | | |
|---|---|---|
| CN | 1445824 A | 10/2003 |
| EP | 1 488 880 A2 | 12/2004 |
| JP | 1-184851 A | 7/1989 |
| JP | 01262092 A * | 10/1989 |
| JP | 05327152 A * | 12/1993 |
| JP | 10-308396 A | 11/1998 |
| JP | 10308396 A * | 11/1998 |
| JP | 2001-284785 A | 10/2001 |
| JP | 2002-60522 A | 2/2002 |
| JP | 2002-110714 A | 4/2002 |
| JP | 2004-031724 A | 1/2004 |
| JP | 2004-055662 A | 2/2004 |
| JP | 2004-363148 A | 12/2004 |
| JP | 2006-086386 A | 3/2006 |
| WO | 02062117 A1 | 8/2002 |
| WO | 2004/038809 A2 | 5/2004 |

OTHER PUBLICATIONS

Machine translation of JP 1992-327152, originally published Dec. 1993.*
Office Action issued on Apr. 21, 2010 in counterpart Chinese Application No. 200810083784.3.

(Continued)

*Primary Examiner* — Nicholas P D'Aniello
(74) *Attorney, Agent, or Firm* — Sughrue Mion, PLLC

(57) ABSTRACT

A soldering structure using Zn includes a bonding layer which contains Zn; and a lead-free solder which bonds and reacts to the bonding layer. The bonding layer can be a Zn alloy layer or a multilayer including a Zn layer. Accordingly, the characteristics of the soldering structure can be improved by involving the high reactive Zn to the interfacial reaction of the soldering.

7 Claims, 16 Drawing Sheets

(56) References Cited

OTHER PUBLICATIONS

Office Action dated Jul. 27, 2010, issued by the Japan Patent Office in counterpart Japanese Patent Application No. 2007-275596.

Japanese Patent Office, Communication dated Jul. 24, 2012, in a counterpart application No. 2010-228990.

Japanese Patent Office, Communication dated Jun. 4, 2013, issued in a counterpart application No. 2010-228990.

* cited by examiner

SOLDERING STRUCTURE AND METHOD USING ZN

CROSS-REFERENCE TO RELATED APPLICATIONS

This application claims priority under 35 U.S.C. §119 from Korean Patent Application No. 10-2007-0024183, filed on Mar. 12, 2007, in the Korean Intellectual Property Office, the disclosure of which is incorporated herein by reference in its entirety.

BACKGROUND OF THE INVENTION

1. Field of the Invention

Structures and methods consistent with the present invention relate to a soldering, and more particularly, to a soldering structure comprising a Zn layer and a soldering method.

2. Description of the Related Art

Soldering, which is one of joining methods required for the electronic joints, joins two components together by melting a third material at the temperature below 450° C. The third material is called solder. Traditionally, a solder comprising lead (Pb) has been used for a long time. However, as it was recognized that lead is poisonous and its use has been regulated, a soldering method using a Pb-free solder is attracting great attention. In the conventional soldering method using a Pb-free solder, a Cu bonding layer is employed between a substrate and the Pb-free solder.

As Pb-free solders, a solder using Sn as the main component is on the rise. An example of a solder structure including a Sn solder is shown in FIG. 1.

The conventional Pb-free soldering structure of FIG. 1 includes a substrate 10, a bonding layer or bonding pad 20, and a solder 30. The bonding layer 20 employs Cu layer. The solder 30 may be made of SnAgCu.

The soldering structure as shown in FIG. 1 shows weak bonding strength and brittleness of the bonding interface, resulting in the decrease in the product reliability. That is, when the solder 30 including Sn is bonded to the bonding layer 20, $Ag_3Sn$ platelets and a $Cu_3Sn$ phase are generated at the interface of the solder 30 and the bonding layer 20. As a result, the soldering structure is prone to break.

After a reflow process is carried out in the conventional soldering process, the Sn-based solder undergoes an undercooling during the cooling process. The undercooling of the Sn solder causes a formation and separation of $Ag_3Sn$ particles, which flow into the undercooled molten Sn. Accordingly, the Pb-free solder is irregularly constituted. The $Ag_3Sn$ particles rapidly grow in the molten Sn and form $Ag_3Sn$ platelets.

In the soldering structure as described above, if cracks occur afterwards, the cracks rapidly spread along the interface on which $Ag_3Sn$ platelets are formed. An electronic device fabricated by bonding a chip onto the substrate using the conventional soldering structure as described above will become defective due to cracks which may formed when an impact is given to the device or the stress is concentrated to the soldered joints. Since the cracks quickly spread in the conventional soldering structure, the solidity of the soldering joint becomes deteriorated.

Meanwhile, in the conventional soldering structure, a thicker inter-metallic compound (IMC) layer may be formed, and thus easily causes a formation of voids.

FIG. 2 is a conceptual diagram of the IMC and the voids generated in the conventional soldering structure. As shown in FIG. 2, when the solder 300 reflows on the bonding layer 20, $Cu_6Sn_5$ phase is generated at the interface area between the bonding layer 20 and the solder 300. Afterwards, $Cu_3Sn$ phase is generated in the interface between $Cu_6Sn_5$ and Cu as aging process proceeds.

The compounds produced in the interface between the metals, such as $Cu_3Sn$ phase and $Cu_6Sn_5$ phase, are commonly called the IMC.

Since the thick IMC of the conventional soldering structure generates voids or pores in the internal interface, the soldering strength deteriorates. In specific, as the solid state diffusion takes place in the generation of the $Cu_3Sn$ phase, voids or pores may be generated in the interface. As a result, the soldering structure may be easily destroyed.

Therefore, the conventional soldering structure and method has difficulty in using the lead-free solder.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a soldering structure and method for enhancing soldering characteristics and reliability by including highly reactive Zn.

According to an aspect of the present invention, there is provided a soldering structure including a bonding layer which contains Zn; and a lead-free solder which bonds and reacts to the bonding layer.

The bonding layer may be a Zn alloy layer.

The Zn alloy layer may be an alloy formed of Zn and at least one selected from groups consisting of Cu, Ag, Au, Pd, Ni, Cr, and Ti.

The bonding layer may contain Zn in an amount of 0.1~30% based on a total weight of the bonding layer.

The thickness of the Zn alloy layer may range 0.5~10 μm.

The bonding layer may be a multilayer including a Zn layer.

When the bonding layer is a multilayer including a Zn layer, the Zn layer may be positioned at the top of the multilayer toward the lead-free solder, and the thickness of the Zn layer may be 1 μm or less.

The soldering structure may further include a substrate which supports the bonding layer.

The soldering structure may further include an insulating layer which insulates the substrate from the lead-free solder.

The lead-free solder may be one of SnAg, SnAgCu, SnCu, SnBi, SnIn, SnZn, SnZnBi, and SnZnIn.

According to the above aspect of the present invention, a soldering method includes forming a bonding layer which contains Zn on a substrate; and forming a lead-free solder on the bonding layer.

The bonding layer may be formed by depositing a Zn alloy layer onto the substrate.

The Zn alloy layer may be deposited onto the substrate using one of a sputtering method, an evaporation method, an electroplating method, and an electroless plating method.

The Zn alloy layer may be an alloy formed of Zn and at least one selected from groups consisting of Cu, Ag, Au, Pd, Ni, Cr, and Ti.

The bonding layer may contain Zn in an amount of 0.1~30% based on a total weight of the Zn alloy layer.

The bonding layer may contain the Zn alloy layer of thickness of 0.5~10 μm. The bonding layer may be multilayered by forming at least one material layer formed of a certain material on to the substrate and forming a Zn layer formed of Zn onto the material layer. In this case, the Zn layer may have the thickness of 1 μm or less.

The formation of the lead-free solder may use one of SnAg, SnAgCu, SnCu, SnBi, SnIn, SnZn, SnZnBi, and SnZnIn as the lead-free solder.

The formation of the bonding layer may include applying and patterning an insulating layer onto the substrate; and forming the bonding layer on the insulating layer and on the substrate. The bonding layer may be formed using one of a sputtering method, an evaporation method, an electroplating method, and an electroless plating method.

The formation of the lead-free solder may include applying a photoresist onto areas, excluding a position for a soldering structure, of the bonding layer; forming the lead-free solder at the position for the soldering structure; and removing the photoresist and the insulating layer, performing a reflow process, and bonding the lead-free solder to the bonding layer.

The formation of the lead-free solder may include applying a photoresist onto areas, excluding a position for a soldering structure, of the bonding layer; applying the lead-free solder at the position for the soldering structure; and removing the photoresist, performing a reflow process, and bonding the lead-free solder to the bonding layer.

BRIEF DESCRIPTION OF THE DRAWINGS

The above and/or other aspects of the present invention will be more apparent by describing certain exemplary embodiments of the present invention with reference to the accompanying drawings, in which.

DETAILED DESCRIPTION OF THE EXEMPLARY EMBODIMENTS

Figure 1:
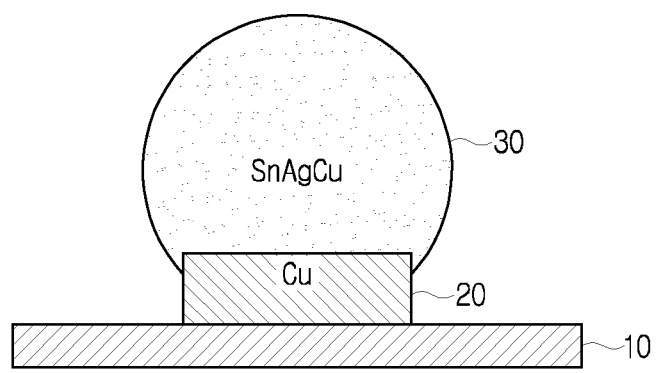
FIG. 1 is a conceptual diagram of a conventional soldering structure.
Figure 2:
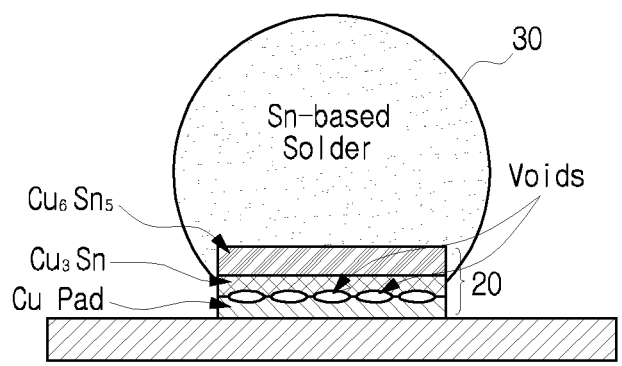
FIG. 2 is a conceptual diagram of the conventional soldering structure to show its drawback.

Certain exemplary embodiments of the present invention will now be described in greater detail with reference to the accompanying drawings.

In the following description, the same drawing reference numerals are used to refer to the same elements, even in different drawings. The matters defined in the following description, such as detailed construction and element descriptions, are provided as examples to assist in a comprehensive understanding of the invention. Also, well-known functions or constructions are not described in detail, since they would obscure the invention in unnecessary detail.

Figure 3:
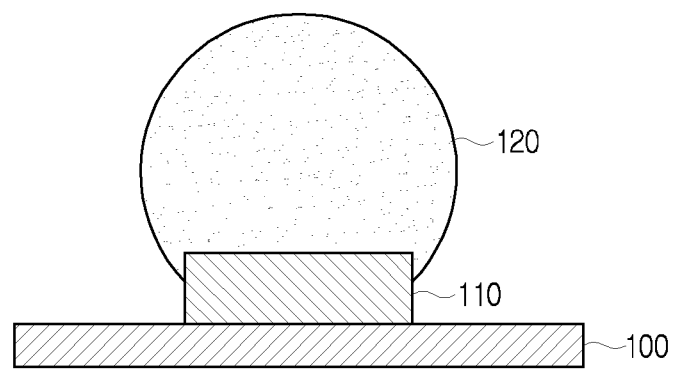
FIG. 3 is a conceptual diagram of a soldering structure according to an exemplary embodiment of the present invention.

FIG. 3 is a conceptual diagram of a soldering structure according to an exemplary embodiment of the present invention. The soldering structure of FIG. 3 includes a substrate 100, a bonding layer 110, and a lead-free solder 120.

The bonding layer 110 can serve as an under bump metallurgy (UBM) or a surface finish metallization to bond a chip (not shown) onto the substrate 100. According to the exemplary embodiment of the present invention, the bonding layer 100 can include a Zn or Zn alloy layer.

In specific, the Zn alloy layer can be made of an alloy consisting of at least one selected from groups consisting of Cu, Ag, Au, Pd, Ni, Cr, and Ti, and Zn. Namely, the Zn alloy layer can be an alloy such as CuZn, AgZn, ZnCuNi, and ZnCuAg. The ratio of Zn can be determined by taking account of the wetting, the type of the chip to be soldered, and the use environment. In an embodiment, the ratio of Zn may range 0.1-30% based on the total weight of the Zn alloy layer.

The thickness of the Zn alloy layer can be determined by the designer. Approximately, the thickness may range 0.5-10 μm.

The bonding layer 110 is formed at a position where a chip (not shown) will be bonded onto the substrate 100. The lead-free solder 120, which is formed on the bonding layer 110, fuses and bonds with the bonding layer 110 to thus form a soldering structure.

The lead-free solder 120 refers to a solder containing no lead. That is, the lead-free solder 120 can be SnAg, SnAgCu, SnCu, SnBi, SnIn, SnZn, SnZnBi, and SnZnIn. In addition to those specified materials, a conventional lead-free solder can be utilized.

When the Zn alloy layer is used as the bonding layer 110, as the lead-free solder 120 is reflowed and cooled on the bonding layer 110, Zn can inhibit the growth of $Ag_3Sn$ platelets and the formation of $Cu_3Sn$ phase in the interface.

That is, Zn slows down the undercooling of the molten Sn within in the lead-free solder 120. Hence, the growth of $Ag_3Sn$ platelets also slows down. Also, since the involvement of Zn slows the growth of $Cu_6Sn_5$ phase, the formation of $Cu_3Sn$ phase is inhibited and/or delayed. Consequently, the formation of voids or pores can be restrained as well.

As such, the soldering structure constituted of the bonding layer 110 and the lead-free solder 120 can serve to bond a chip (not shown) onto the substrate 100. Besides, the soldering structure can be utilized for the flip chip packaging, the ball grid array packaging, the wafer bonding, the staking, and so on.

Figure 4:
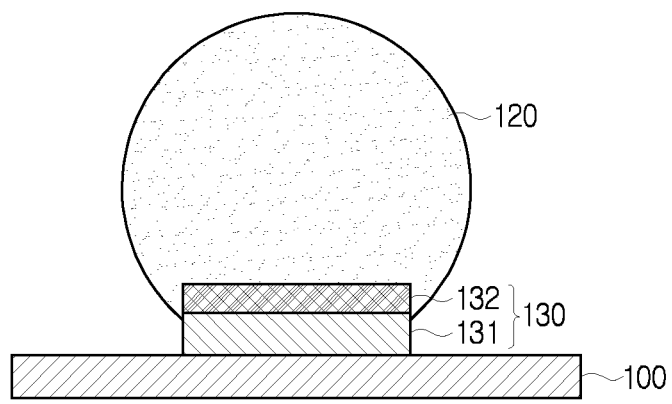
FIG. 4 is a conceptual diagram of a soldering structure according to another exemplary embodiment of the present invention.

FIG. 4 is a conceptual diagram of a soldering structure according to another exemplary embodiment of the present invention. The soldering structure of FIG. 4 has the substantially similar structure to the soldering structure of FIG. 3. A difference lies in that the bonding layer 130 is multilayered. The bonding layer 130 can be multilayered by sequentially depositing a material layer 131 and a Zn layer 132. The number of the material layer 131 may be one or more. When two or more material layers 131 are formed, each of respective layers 131 may be formed of a same material or different materials. For example, the material layer 131 can be implemented using the Cu layer of the conventional soldering structure or other materials.

It is preferable to deposit the Zn layer 132 at the highest layer of the bonding layer 130. Accordingly, when the lead-free solder 120 is formed on the bonding layer 130, the Zn layer 132 directly reacts to the lead-free solder 120 and thus changes the reaction mechanism in the interface. In more detail, as Sn of the lead-free solder 120 spreads toward the bonding layer 130 and Cu and Zn of the material layer 131 and the Zn layer 132 spread the lead-free solder 120 during the reflow process, the coupling reaction forms the molten $Cu_6Sn_5$ phase. In this process, the involvement of Zn blocks the growth of $Ag_3Sn$ platelets and the formation of $Cu_3Sn$ phase. It is preferable to implement the Zn layer 132 with the thickness of about 1 μm or less. Other structures than the bonding layer 130 in FIG. 4 are the substantially similar to the structures of FIG. 3 and thus further descriptions shall be omitted.

Figure 5:
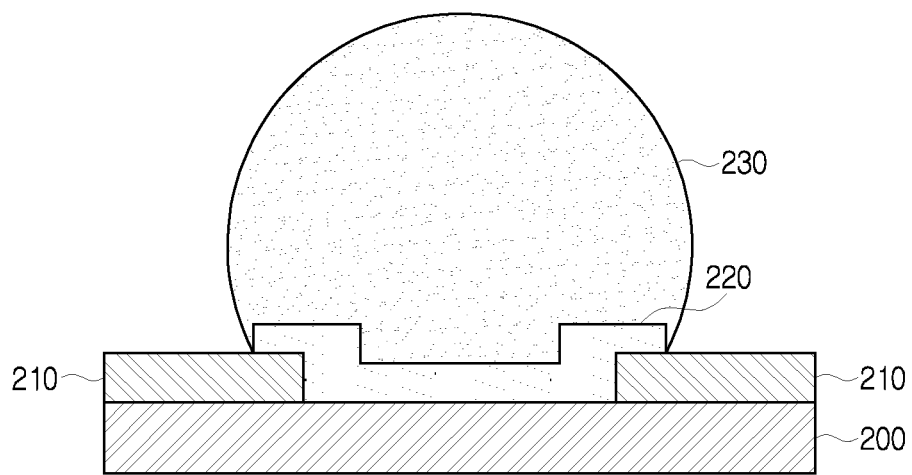
FIG. 5 is a conceptual diagram of a soldering structure according to still another exemplary embodiment of the present invention.

FIG. 5 is a conceptual diagram of a soldering structure according to still another exemplary embodiment of the present invention. The soldering structure of FIG. 5 includes a substrate 200, an insulating layer 210, a bonding layer 220, and a lead-free solder 230.

The bonding layer 220 can be implemented using the Zn alloy layer as shown in FIG. 3, or using the multilayer including the Zn layer as exemplified in FIG. 4. As shown in FIG. 5, part of the bonding layer 220 can be formed on the surface of the insulating layer 210 and the other parts can be formed directly on the substrate 200.

The substrate 200 serves to support the soldering structure constituted of the bonding layer 220 and the lead-free solder 230, and a chip (not shown) which is mounted onto the substrate 200 through the soldering structure.

The insulating layer 210 functions to insulate the lead-free solder 230 and the substrate 200. Hence, the signal leakage between the chip joining through the soldering structure and the substrate 200 can be avoided.

The components other than the insulating layer 210 and the bonding layer 220 in FIG. 5 have the substantially similar structures to the components of FIGS. 3 and 4, and thus further explanations shall be omitted.

FIGS. 6A through 6E are conceptual diagrams of a soldering method using the soldering structure of FIG. 5.

Figure 6A:
FIGS. 6A through 6E are conceptual diagrams of a method for manufacturing the soldering structure of FIG. 5.

Referring first to FIG. 6A, a position for the soldering structure is exposed by depositing and patterning the insulating layer 210 on the substrate 200. The insulating layer 210 can be formed of an insulating material such as $SiO_2$ or $Al_2O_3$.

Figure 6B:
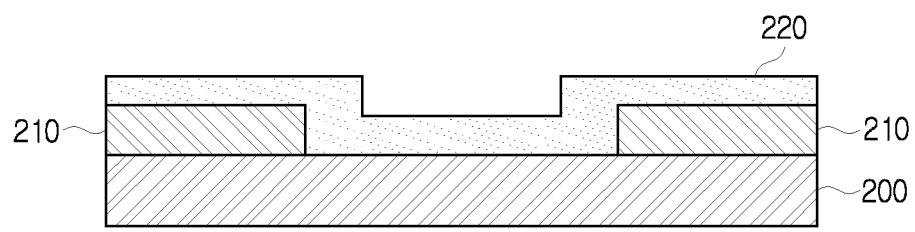

The bonding layer 220 containing Zn is deposited all over the insulating layer 210 and the substrate 200 as shown in FIG. 6B. The bonding layer 220 can be formed of a Zn alloy layer. Alternatively, the bonding layer 220 can be multilayered by sequentially depositing a plurality of layers all over the insulating layer 210 and the substrate 200 and finally depositing the Zn layer.

The bonding layer 220 can be deposited using the sputtering method, the evaporation method, the electroplating method, and the electroless plating method. Besides, the depositing technique known in the related art can be applied.

The sputtering method can be classified to DC, RF (radio frequency), DC magnetron methods and RF magnetron sputtering method. As for the DC sputtering method, a Zn alloy target to be used as the bonding layer 220 is separately fabricated. To fabricate the Zn alloy target, an alloy sample is fabricated by putting Zn and other metallic materials at desired ratios into a vacuum oven filled with the argon gas and arc-melting them. Next, the Zn alloy target is acquired by cutting the fabricated alloy sample in a preset size.

When the Zn alloy target is prepared, the substrate 200 having the insulating layer 210 and the Zn alloy target are put into the sputtering chamber all together and then the sputtering is executed. An inert gas such as argon is put into the sputtering chamber, and the argon is ionized using DC, RF, DC magnetron, and RF magnetron. The generated argon ions accelerate to and collide with the target due to the potential difference, and neutral target atoms are ejected. The ejected target atoms are deposited onto the substrate 200 having the insulating layer 210 and thus form the bonding layer 220. The principle of DC sputtering method may be employed to form a multilayered bonding layer including a Zn layer.

Since the sputtering method is well known in the art, the other sputtering methods are not described in detail.

The evaporation method can be classified into a thermal evaporation method using the resistance heat, and an electron beam evaporation method using the electron beam, of which detailed explanation shall be omitted.

Although not specifically shown in FIG. 6B, after the bonding layer 220 is deposited, the bonding layer 220 can lie only at the position to be soldered by depositing a photoresist (not shown) on the bonding layer 220 and patterning the bonding layer 220 in a certain shape. When the patterning of the bonding layer 220 is completed, the photoresist (not shown) is eliminated and the subsequent process is processed.

Figure 6C:
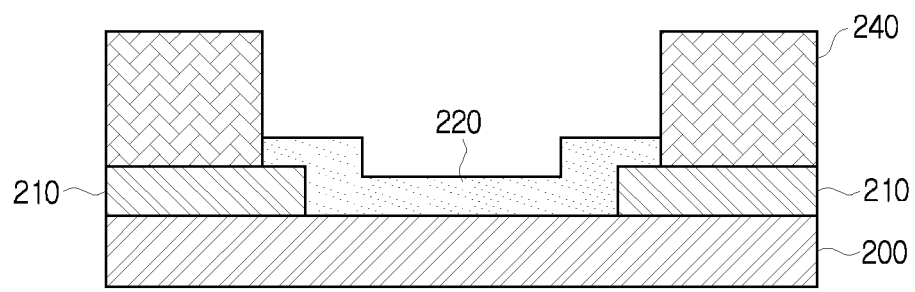
Figure 6D:
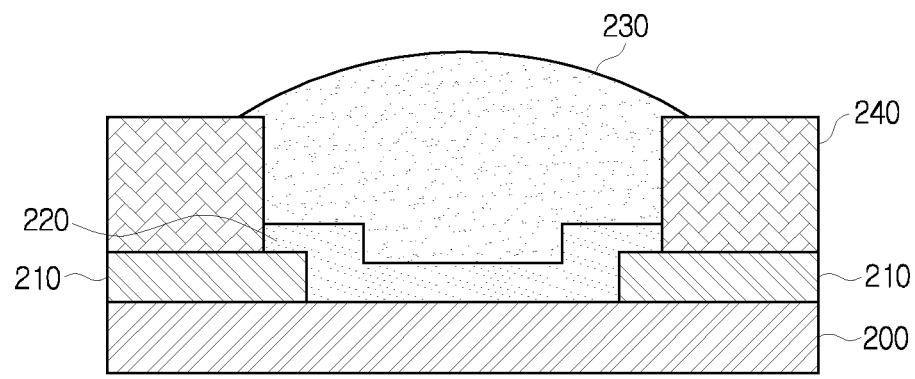

After eliminating part of the bonding layer 220 and forming the photoresist 240 as shown in FIGS. 6C and 6D, the lead-free solder 230 is deposited. The lead-free solder 230 can be deposited on the bonding layer 220 using one of the electroplating method, the electroless plating method, the vacuum evaporation method, the solder ball transfer method, the stud bumping method, the solder jet method, and so on.

Figure 6E:
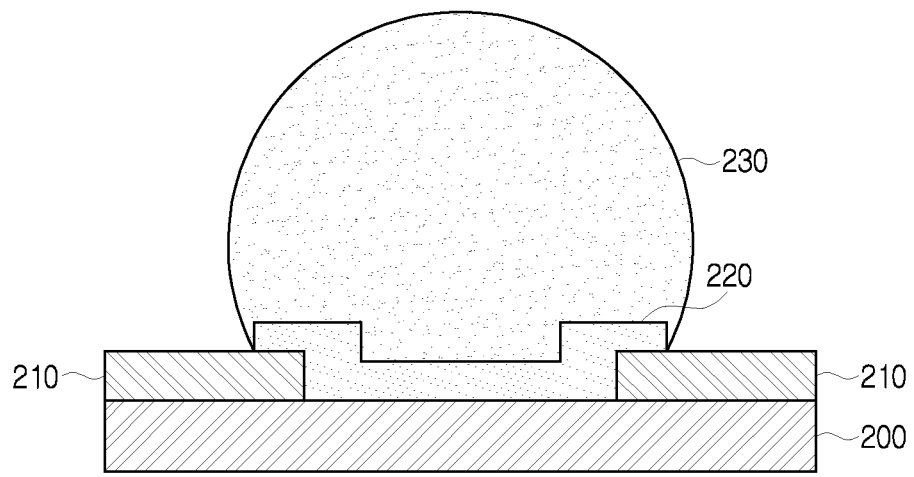

Next, after eliminating the photoresist 240, the soldering structure is fabricated by dissolving and aging the lead-free solder 230 using the reflow as shown in FIG. 6E. After the reflow process, the lead-free solder 230 can be ball-shaped according to the surface tension in the aging process as shown in FIG. 6E. Hence, when the soldering structure is fabricated, the soldering can be achieved by closely contacting and bonding the chip (not shown) onto the substrate 200.

FIGS. 7A through 7D are conceptual diagrams of a soldering method using the soldering structures of FIGS. 3 and 4.

Figure 7A:
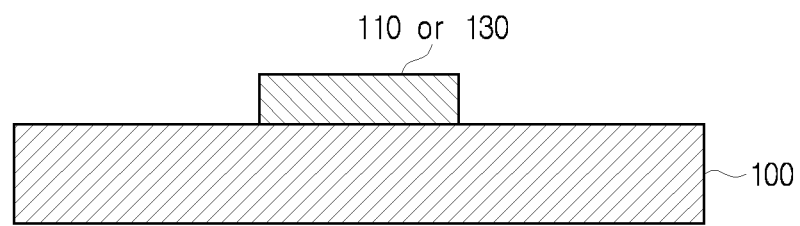
FIGS. 7A through 7D are conceptual diagrams of methods for manufacturing the soldering structures of FIGS. 3 and 4.

In FIG. 7A, a bonding layer 110 or 130 containing Zn is deposited on a substrate 100 in a certain shape. The bonding layer can be implemented using the Zn alloy layer 110 or the multilayer 130 containing Zn. In case of the multiplayer 130, at least one material layer 131 is first deposited and then the Zn layer 132 is deposited.

Figure 7B:
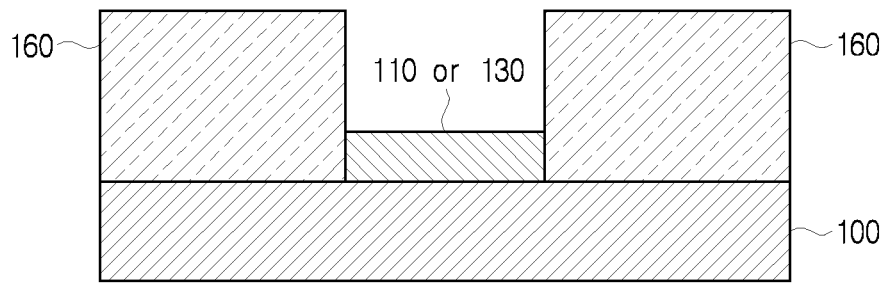
Figure 7C:
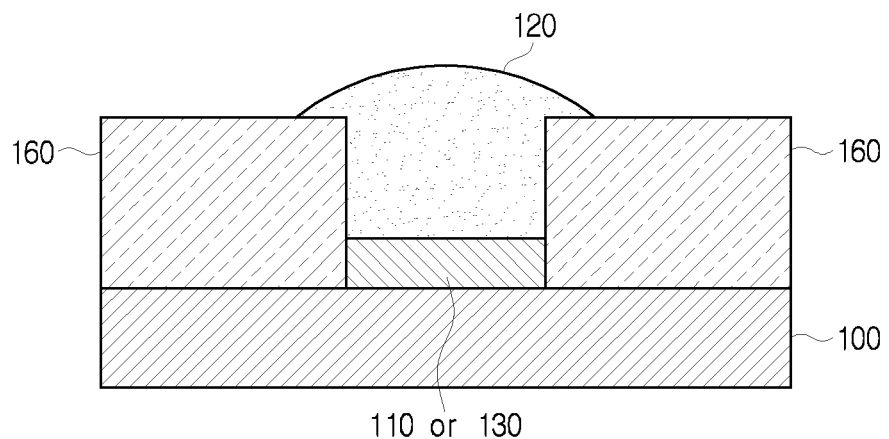

Next, after depositing a photoresist 160, a lead-free solder 120 is deposited as shown in FIGS. 7B and 7C.

Figure 7D:
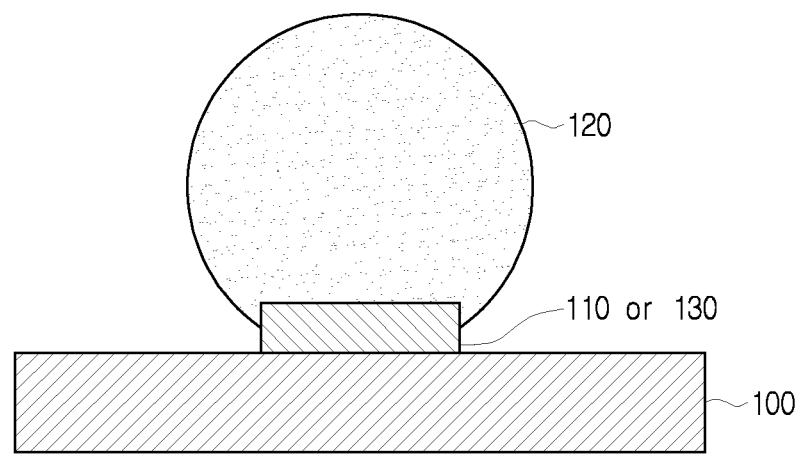

After eliminating the photoresist 160 as shown in FIG. 7D, the soldering structure of FIG. 3 or 4 is fabricated through the reflow. Next, by closely contacting a chip (not shown) to the soldering structure, the soldering can bond the chip onto the substrate 100.

The detailed explanations of FIGS. 7B, 7C, and 7D are substantially similar to the descriptions of FIGS. 6C, 6D, and 6E, and thus shall be omitted.

Note that the process orders and the methods of FIGS. 6A through 6E and 7A through 7D can be changed based on the techniques known in the art.

Now, characteristics of the soldering structure are specifically illustrated by referring to FIGS. 8A through 11B.

Figure 8A:
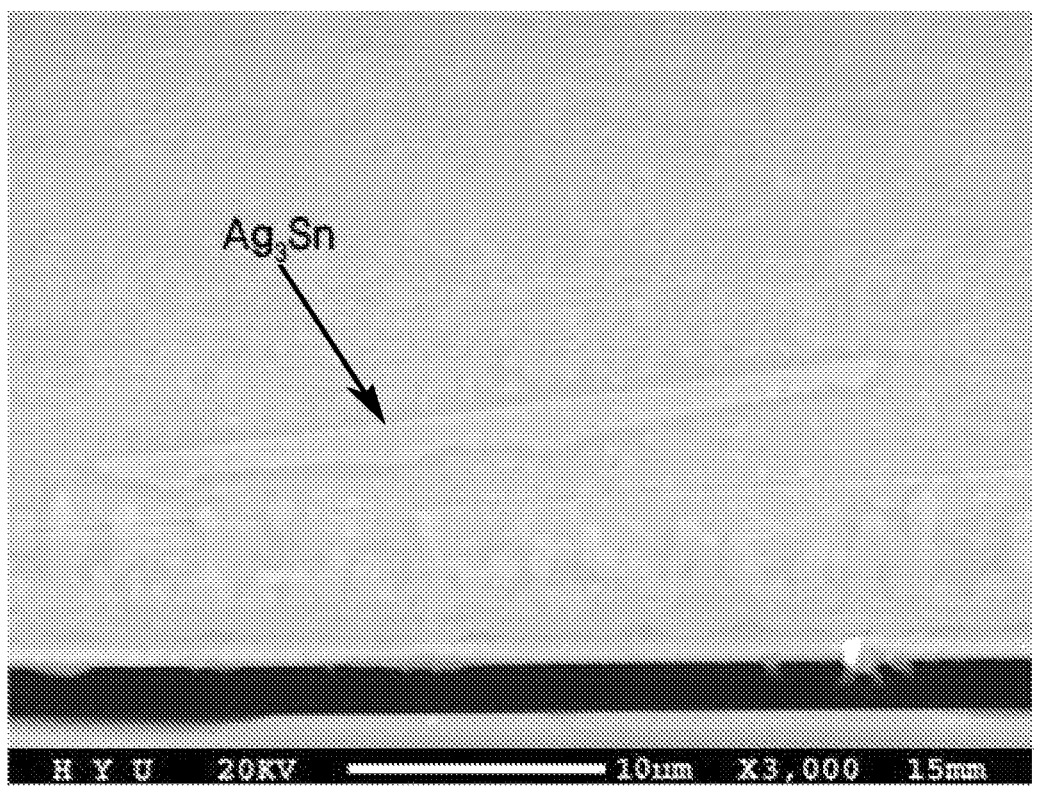
FIGS. 8A, 8B, 9A, 9B, 10A, 10B, 11A, and 11B are pictures taken by an electron microscope to compare characteristics of the conventional soldering structure and the present soldering structures.

FIG. 8A is picture taken by an electron microscope after the reflow process is completed for the conventional soldering structure using the Cu layer as the bonding layer. In FIG. 8A, a considerably large $Ag_3Sn$ platelet structure is observed at the spot pointed by the arrow.

Figure 8B:
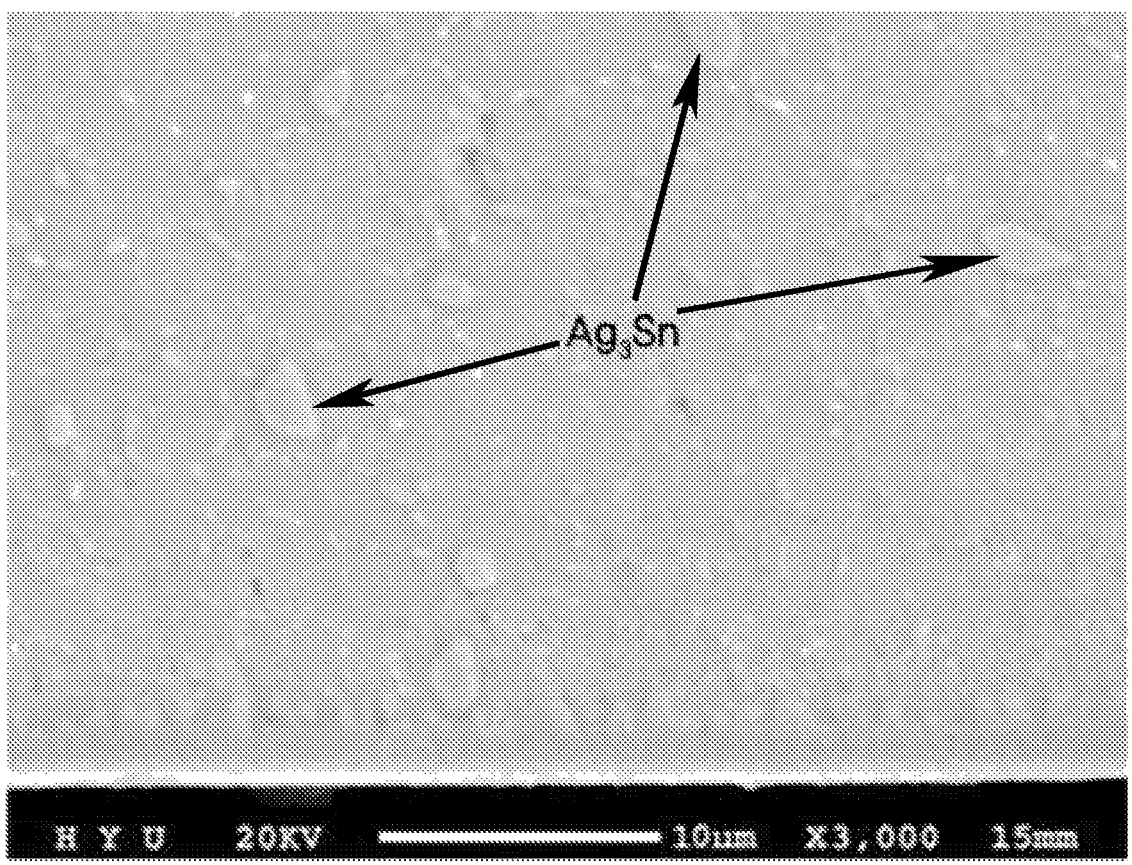

By contrast, FIG. 8B is a picture taken by the electron microscope after the reflow process is completed for the soldering structure which uses the Zn alloy layer consisting of $Cu_7Zn$ as the bonding layer according to the exemplary embodiment of the present invention. $Cu_7Zn$ indicates that Cu occupies 93% and Zn occupies 7% in the total weight of the Zn alloy layer. As shown in FIG. 8B, the growth of the Ag$_3$Sn platelets was restrained comparing to the FIG. 8A and accordingly, and relatively small Ag$_3$Sn platelets were formed.

Figure 9A:
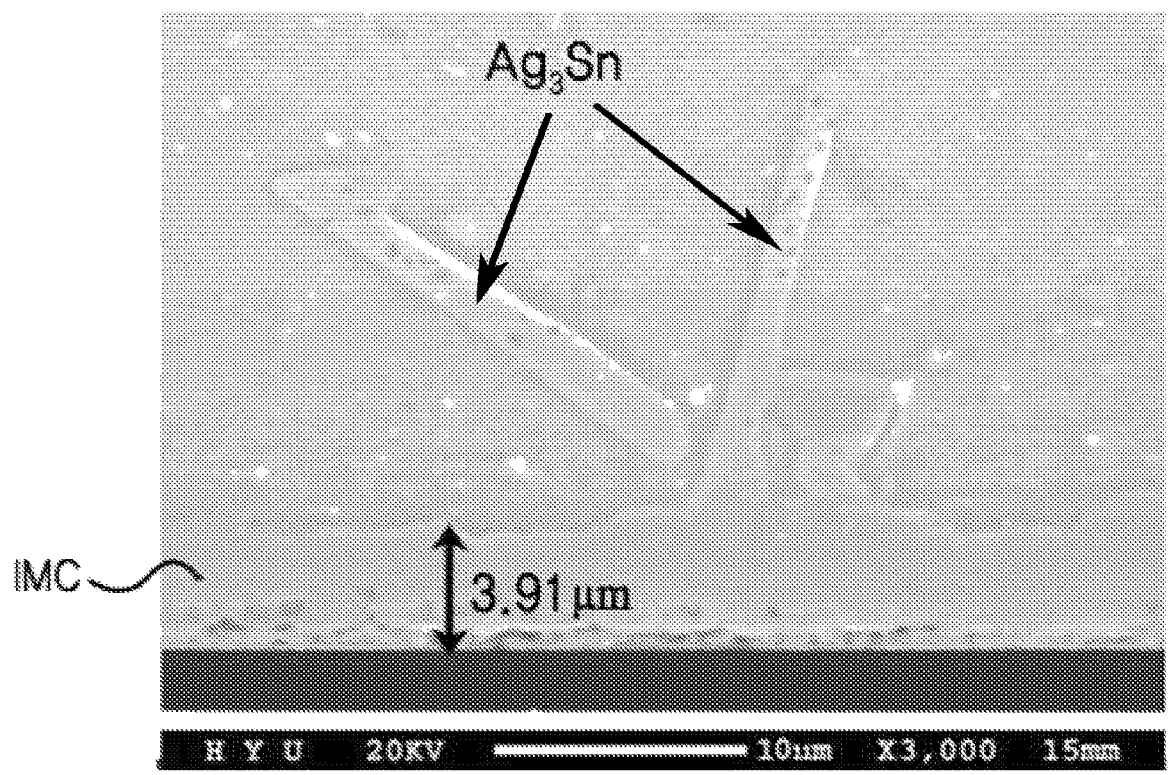
Figure 9B:
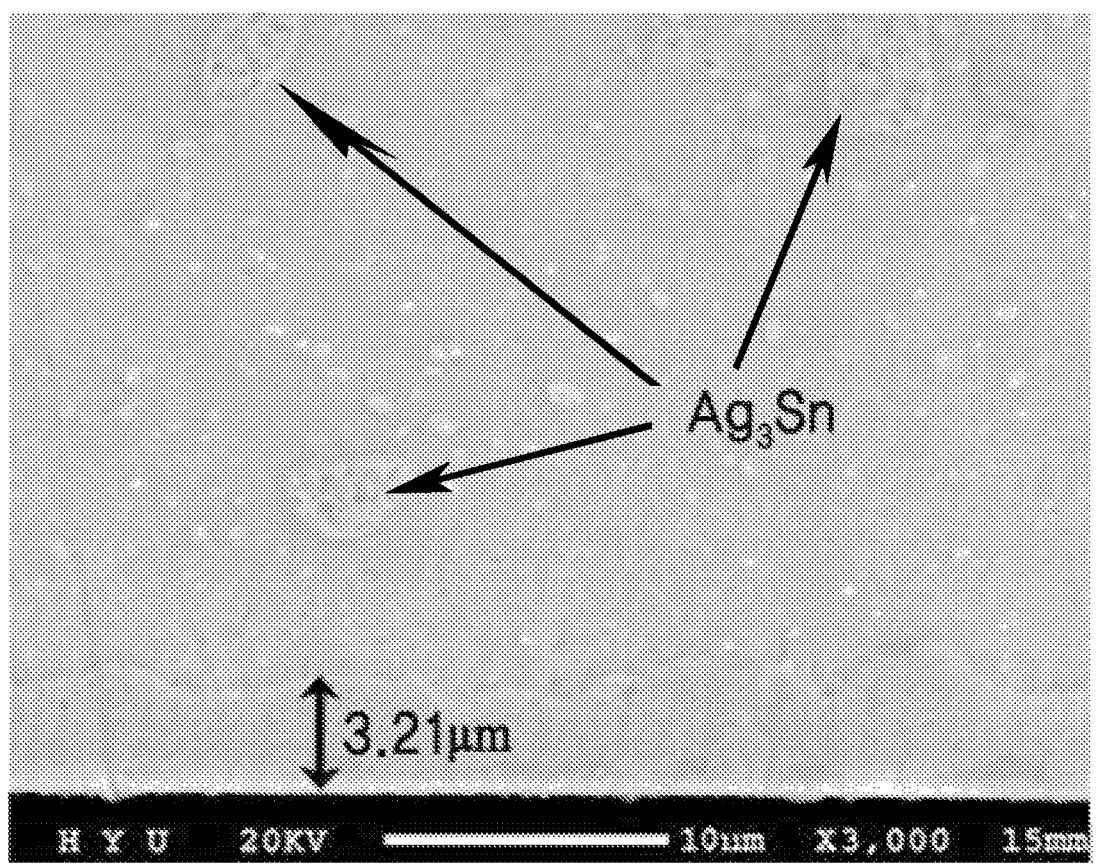

FIGS. 9A and 9B are pictures taken by the electron microscope after aging the conventional soldering structure of FIG. 8A and the present soldering structure of FIG. 8B at 150° C. for about 50 hours.

As shown in FIG. 9A, the size and number of Ag$_3$Sn platelets increased and particularly, an IMC layer of about 3.91 μm was formed. As described earlier, the IMC is the compound formed in the interface between the bonding layer and the solder. The IMC in FIG. 9A is the Cu$_3$Sn phase and Cu$_6$Sn$_5$ phase.

In FIG. 9B, there were little changes in the size of Ag$_3$Sn platelets and an IMC layer of about 3.21 μm was formed. As described earlier, since the growth of Cu$_3$Sn phase was restrained in the soldering structures according to embodiments of the present invention, the thickness of the IMC was smaller than that of the conventional soldering structure.

Figure 10A:
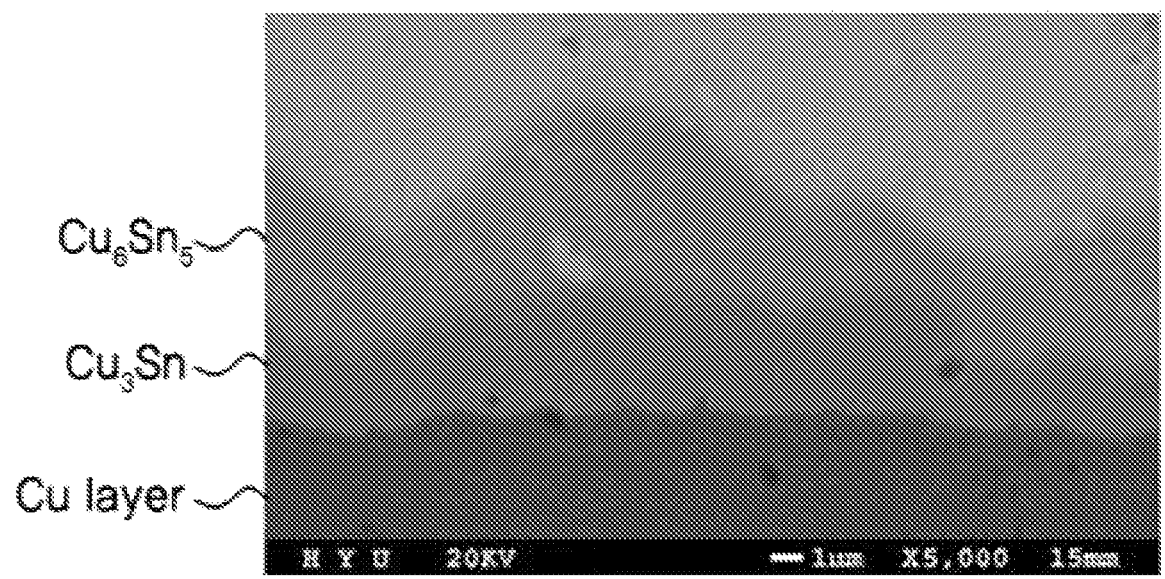
Figure 10B:

FIGS. 10A and 10B are pictures of the interface state after aging the conventional soldering structure using Cu layer as the bonding layer and the present soldering structure using Cu$_{10}$Zn as the bonding layer at 150° C. for about 500 hours, which are taken by the electron microscope.

As one can see from FIG. 10A, Cu$_3$Sn phase and Cu$_6$Sn$_5$ phase are sequentially positioned on the Cu layer. After Cu$_6$Sn$_5$ phase was formed in the reflow process, Cu$_3$Sn phase was formed in the interface between the Cu$_6$Sn$_5$ phase and the Cu layer in the aging process. As a result, the 3-layered structure was produced as shown in FIG. 10A.

With refer to FIG. 10B, Cu$_6$Sn$_5$ phase was formed on the Cu$_{10}$Zn bonding layer. That is, by using the Zn alloy layer as the bonding layer, Cu$_3$Sn phase was hardly formed. Thus, voids were scarcely formed as shown in FIG. 11B.

Figure 11A:
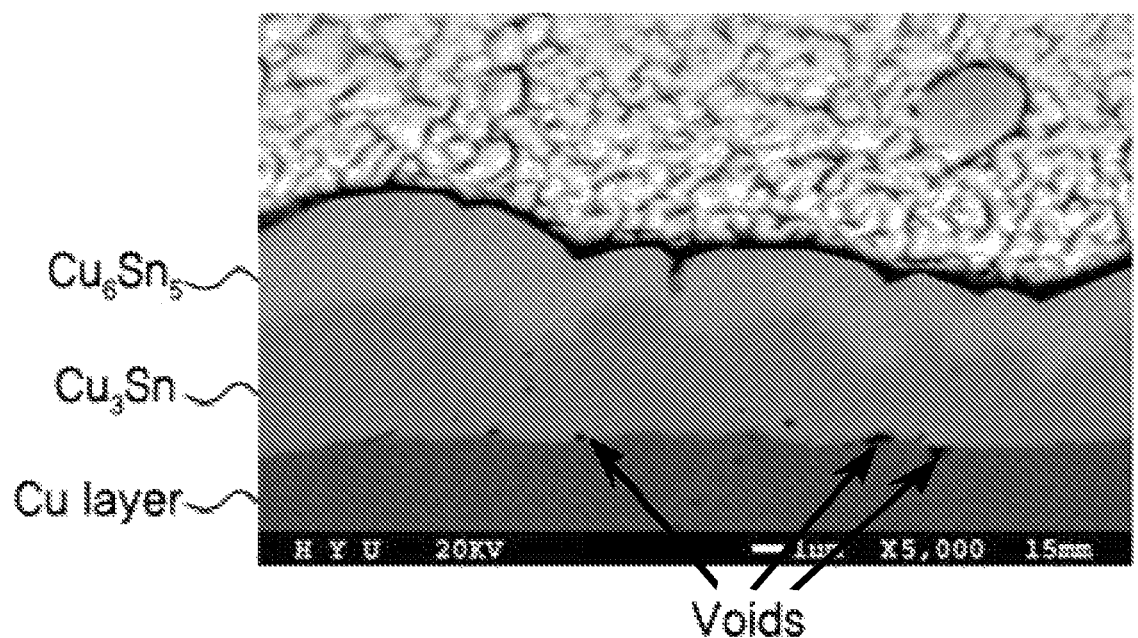
Figure 11B:
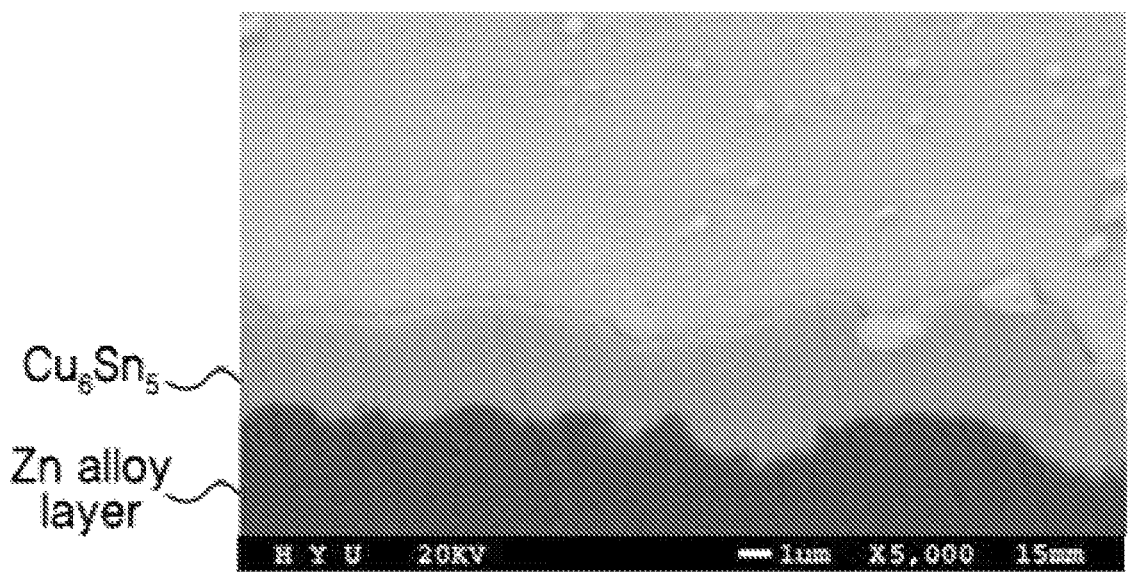

FIGS. 11A and 11B are electronic microscopic pictures of the interface state after further aging the soldering structures of FIGS. 10A and 10B for about 500 hours. In other words, FIGS. 11A and 11B show the state after the aging at 150° C. for a total of about 1000 hours after the reflow process.

In FIG. 11A, the thickness of Cu$_3$Sn layer greatly increased. It is presumed that the solid state diffusion occurred in the formation of Cu$_3$Sn phase. As Cu atoms in the Cu layer moved to the lead-free solder, voids were generated. Black spots in the surface of the Cu layer in FIG. 11 are the voids. By contrast, in FIG. 11B, no Cu$_3$Sn layer or voids are observed.

As shown in FIGS. 8A through 11B, the solidity of the present soldering structure is far more improved, compared to the conventional soldering structure using the Cu layer as the bonding layer.

Figure 12:
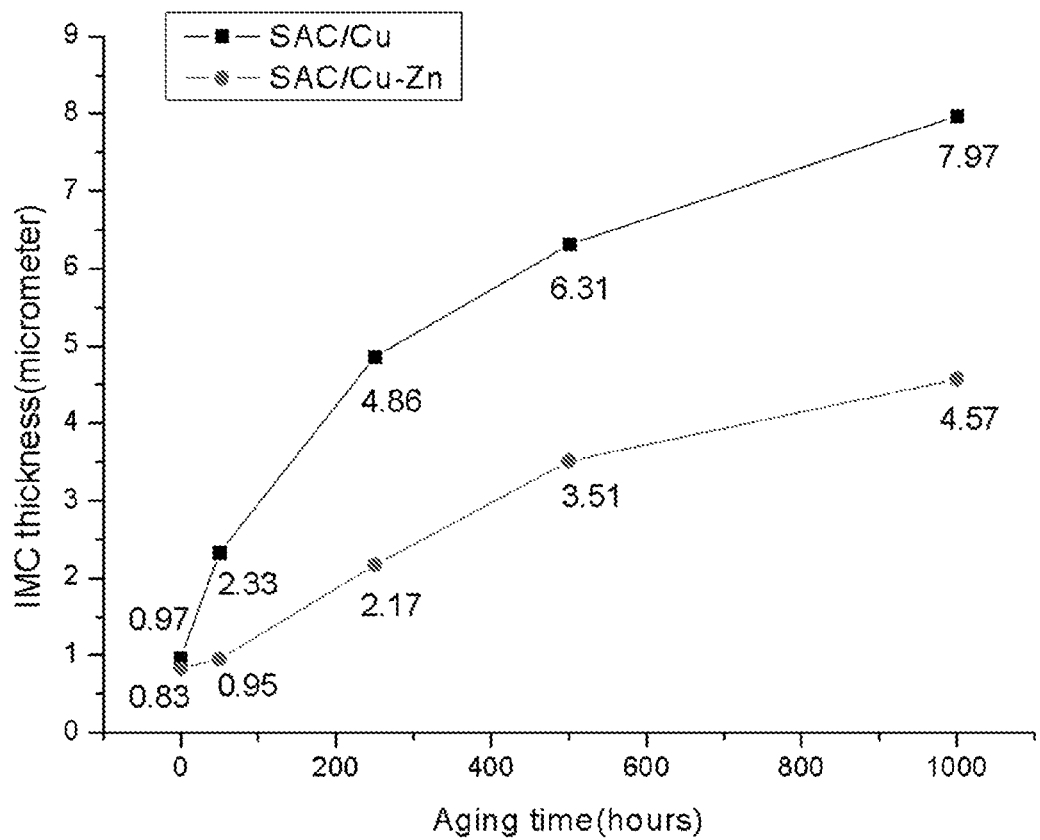
FIG. 12 is a graph showing IMC thickness variation based on the aging time to compare the characteristics of the conventional soldering structure and the present soldering structures.

FIG. 12 is a graph showing the IMC thickness variation of the conventional soldering structure and the present soldering structures, with respect to the aging time. Particularly, the IMC thickness of FIG. 12 was measured by reflowing at 260° C. for 30 seconds and then aging at 150° C.

In FIG. 12, when the soldering structure (■) fabricated using SnAgCu lead-free solder and Cu bonding layer was aged for 500 hours, the IMC of the thickness about 6.31 μm was formed. After the aging for about 1000 hours, the IMC of the thickness about 7.97 μm was formed.

By contrast, when the soldering structure (●) fabricated using SnAgCu lead-free solder and Cu$_{10}$Zn bonding layer was aged for 500 hours, the IMC of the thickness 3.51 μm was formed. Under the aging for about 1000 hours, the IMC of the thickness 4.57 μm was formed.

In the two graphs, the soldering structure according to an embodiment of the present invention showed the remarkably slowed IMC growth rate, compared to the conventional soldering structure. Accordingly, the formation of the flaws such as voids could be restricted. Consequently, the brittle fracture could be prevented.

As set forth above, the growth of Ag$_3$Sn platelets can be restrained and the growth of the IMC can be slowed down by using the lead-free solder and employing a Zn bonding layer (or bonding pad). Thus, the rapid spread of the cracks can be avoided and the formation of the flaws such as voids or pores can be minimized. Therefore, the solid soldering structure of high reliability of soldering joints can be acquired.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A soldering structure comprising:
   a substrate;
   a bonding layer formed directly on the substrate and comprises a first surface in direct contact with a portion of one surface of the substrate; and
   a lead-free solder which is formed on and directly bonds to a second surface of the bonding layer,
   wherein a portion of the bonding layer directly contacts the lead-free solder and the portion contains Zn,
   wherein the bonding layer is a single-layer material layer, wherein the bonding layer is a Zn alloy layer,
   wherein the substrate is a supporting structure, and the one surface of the substrate is greater in size than the first surface of the bonding layer, and
   wherein the Zn alloy layer is an alloy consisting of Zn and at least one selected from the group consisting of Cu, Au, Pd, Ni, Cr, and Ti.

2. The soldering structure of claim 1, wherein the bonding layer contains Zn in an amount of 0.1~30% based on a total weight of the Zn alloy layer.

3. The soldering structure of claim 1, wherein a thickness of the Zn alloy layer ranges 0.5~10 μm.

4. The soldering structure of claim 1, wherein the substrate supports the bonding layer.

5. The soldering structure of claim 4, further comprising:
   an insulating layer which insulates the substrate from the lead-free solder.

6. The soldering structure of claim 1, wherein the lead-free solder is one of SnBi, SnIn, SnZn, SnZnBi, and SnZnIn.

7. The soldering structure of claim 1, further comprising a chip attached to the substrate via the lead-free solder.

* * * * *